United States Patent [19]

Yosomiya et al.

[11] Patent Number: 5,183,611
[45] Date of Patent: Feb. 2, 1993

[54] METHOD OF PRODUCING POLYMER ARTICLE HAVING METALLIZED SURFACE

[75] Inventors: Ryutoku Yosomiya; Mistutoshi Hirata, both of Funabashi; Kiyotaka Morimoto, Koshigaya; Soichiro Takenishi, Tokushima; Toshinori Marutsuka, Tokyo, all of Japan

[73] Assignee: Nisshinbo Industries, Inc., Tokyo, Japan

[21] Appl. No.: 278,202

[22] Filed: Nov. 30, 1988

[30] Foreign Application Priority Data

Nov. 30, 1987 [JP] Japan .................................. 62-299878

[51] Int. Cl.$^5$ ................................................ B05D 3/10
[52] U.S. Cl. .................................. 264/129; 264/178 F; 264/232; 264/340; 427/343; 427/400
[58] Field of Search .................... 264/211, 129, 178 F, 264/104, 232, 340; 427/443.1, 444, 126.1, 111, 335, 343, 400

[56] References Cited

U.S. PATENT DOCUMENTS

| | | | |
|---|---|---|---|
| 3,056,169 | 10/1962 | Hendricks | 264/104 |
| 3,058,845 | 10/1962 | Hendricks | 427/343 |
| 3,097,054 | 7/1963 | Routson et al. | 264/210.6 |
| 3,099,517 | 7/1963 | Hurley et al. | 264/210.6 |
| 3,523,824 | 11/1970 | Powers | 117/239 |
| 3,953,565 | 4/1976 | Mizutani et al. | 264/211 |
| 3,962,494 | 6/1976 | Nuzzi | 427/304 |
| 4,199,623 | 4/1980 | Nuzzi et al. | 427/343 |
| 4,234,628 | 11/1980 | DuRose | 427/343 |
| 4,378,226 | 3/1983 | Tomibe et al. | 427/343 |
| 4,564,424 | 1/1986 | Cassat et al. | 204/20 |
| 4,663,199 | 5/1987 | Liebler et al. | 427/162 |

FOREIGN PATENT DOCUMENTS

| | | | |
|---|---|---|---|
| 0043485 | 1/1982 | European Pat. Off. | |
| 1149142 | 12/1954 | Fed. Rep. of Germany | 427/343 |
| 0644409 | 6/1928 | France | 427/343 |
| 49-048171 | 12/1974 | Japan . | |
| 52-155138 | 12/1977 | Japan . | |
| 57-43977 | 3/1982 | Japan . | |
| 59-207938 | 11/1984 | Japan . | |
| 60-36667 | 2/1985 | Japan . | |

Primary Examiner—Leo B. Tentoni
Attorney, Agent, or Firm—Wenderoth, Lind & Ponack

[57] ABSTRACT

A method of producing a polymer article having a metallized surface, which comprises dissolving a polymer and a metal salt in a common solvent, forming a polymer article containing the metal salt dispersed therein from the solution, and then treating the article with a reducing agent.

8 Claims, No Drawings

METHOD OF PRODUCING POLYMER ARTICLE HAVING METALLIZED SURFACE

This invention relates to a method of producing a polymer article having a metallic layer on its surface.

Polymer articles having a metallic surface layer are used as panel heaters, circuit base boards, capacitors, electromagnetic radiation shielding materials and electrically conductive fibers by utilizing their electric conductivity and also as visible light or infrared ray reflectors by utilizing their reflecting characteristics.

Vacuum evaporation and sputtering have been widely used as methods of producing the polymer articles having a metallic surface layer. The metallic films obtained by these methods, however, have low adhesion to the substrate and tend to be easily peeled, and moreover, the equipment for film deposition is expensive.

Japanese Laid-Open Patent Publication No. 207938/1984 proposes a method of obtaining a polymer having a metallized surface which comprises bringing the surface of a polymeric film containing an organic metal complex into intimate contact with a suitable substrate for metallization, and heat-treating the assembly. This method has the advantage that since the resulting metallic layer is integrated with the polymer, no problem of peeling arises. However, the method described in this patent document includes an essential step of bringing the surface of the polymer into intimate contact with the substrate to be metallized, it can be applied only to polymers in the form of a film or plate, and cannot be used for polymers of other shapes such as fibers, rods and three-dimensional articles. Furthermore, the heat-treatment temperature is relatively high (100° to 350° C.), and the manufacturing equipment is relatively expensive.

As a pre-treatment of a polymer article for electroless plating or electroplating, it was proposed to wet-treat the surface to be metallized of a polymer article with a solution containing a reducible metal salt and a subsidiary reducing agent or a solution of a certain organometallic compound, and then reduce the metal compound (see, for example, Japanese Laid-Open Patent Publications Nos. 155138/1977 and 43977/1982), or to reduce a polymer film having dispersed therein a fine particulate non-conductive metallic oxide (see, for example, Japanese Laid-Open Patent Publication No. 36667/1985).

These pre-treatment operations are carried out prior to electroless plating or electroplating, and it is extremely difficult to render the polymer article electrically conductive without an after-treatment (plating). Furthermore, the above methods cannot be applied to a polymer article not wetted with a solution of an organometallic compound. In the method of reducing the polymer film having the particulate non-conductive metallic oxide dispersed therein, uniform electric conductivity is difficult to obtain, and the plated film tends to present a coarse appearance.

It is a primary object of this invention to solve the problems of the prior art, and to provide a method of producing a surface-metallized polymer article, by which a metallic layer integrated with the polymer and being free from peeling and having resistance to mechanical stresses such as bending can be obtained easily at low temperatures, and which can be applied to polymer articles of any shapes.

Thus, according to this invention, there is provided a method of producing a polymer article having a metallized surface, which comprises dissolving a polymer and a metal salt in a common solvent, forming a polymer article containing the metal salt dispersed therein from the solution, and then treating the article with a reducing agent.

According to the method of the invention, treatment of the polymer article containing the metal salt dispersed therein with a reducing agent results in reduction of the metal salt contained in the polymer article, and a metallic surface layer integrated with the polymer is formed over the entire surface of the polymer article which is in contact with the reducing agent. Analysis of the behaviors of the metal ions inside the polymer by an X-ray microanalyzer shows that the metal ions uniformly distributed before the reduction are concentratingly deposited on the surface of the polymer after the reduction. Consequently, the method of this invention exhibits the industrially excellent effect that without the need for a surface metallizing treatment such as electroplating or electroless plating, a surface-metallized polymer article of high quality can be produced by one-step treatment.

The invention will be described below in detail.

The polymer used in this invention is not limited in type so long as it is soluble in the solvent and has affinity for the metal salts. Examples of polymers that can be used in this invention include polyimide resins, polyamide resins, poly(meth)acrylate resins, polyacrylonitrile resins, polycarbonate resins, polystyrene resins, polyvinyl chloride resins, polyurethane resins, saturated polyester resins, unsaturated polyester resins, and epoxy resins. Specific examples of those which are film-forming or fiber-forming are polyacrylonitrile polymers, for example polyacrylonitrile and acrylonitrile copolymers such as acrylonitrile/styrene copolymer and acrylonitrile/vinyl acetate copolymer; vinylidene fluoride polymers, for example polyvinylidene fluoride and vinylidene fluoride copolymers such as vinylidene fluoride/tetrafluoroethylene copolymer and vinylidene fluoride/trichloroethylene copolymer; vinyl chloride polymers, for example vinyl chloride/vinyl acetate copolymer and vinyl chloride/propylene copolymer; polyimide precursors; polyamide precursors; and polybenzimidazole precursors.

The metal salt used in the invention is preferably an organic or inorganic, particularly inorganic, metal salt which can be reduced with the reducing agent to be described and is soluble in the common solvent for the polymer and the metal salt. Desirably, such metal salts are stable to atmosphere and moisture. Examples of the metal salt are sulfates, nitrates, chlorides and organic salts (e.g., acetates) of metals of Groups Ib, IIb, VIb and VIII of the periodic table such as iron, copper, nickel, cobalt, zinc, chromium or palladium. These metal salts are used singly or in combination.

The amount of the metal salt with respect to the polymer is not critical, and can be varied over a wide range depending upon, for example, the properties required of the final polymer article having a metallized surface (such as electric conductivity, mechanical strength) and the type of the metal salt. Generally, it is convenient to use the metal salt in an amount of 1 to 200 parts by weight, preferably 5 to 150 parts by weight, more preferably 10 to 140 parts by weight, per 100 parts by weight of the polymer.

The polymer and the metal salt are dissolved in a common solvent capable of dissolving both. The common solvent can be properly selected depending upon the combination of the polymer and the metal salt used. Usually, it desirably has a boiling point of less than about 200° C. and a low latent heat of evaporation. Specific examples of the common solvent include halogenated hydrocarbons such as chloroform, methylene chloride, trichloroethylene and tetrachloroethylene; hydrocarbons such as benzene, toluene and xylene; ketones such as acetone and cyclohexanone; esters such as ethyl acetate; ethers such as tetrahydrofuran and dioxane; and dimethylformamide, dimethyl sulfoxide, dimethylacetamide and N-methylpyrrolidone. They may be used either singly or as a mixture of two or more.

The amount of the solvent used is selected so that it has viscosity and flowability suitable for sufficiently dissolving the polymer and uniformly dispersing the metal salt and that a polymer article of the desired shape can be formed from the resulting solution. Desirably, the solids concentration of the resulting solution is 10 to 40% by weight, preferably 20 to 30% by weight.

If the polymer and/or the metal salt is difficult to dissolve in the solvent, they can be dissolved in it under heat.

The resulting solution containing the polymer and the metal salt is formed into an article of the polymer containing the dispersed metal salt having the desired shape by known methods. The polymer article may be any of a variety of articles including not only films, sheets, plates, fibers, rods, tubes, spheres and other three-dimensional articles, but also a coated film applied to a suitable substrate surface.

The solution can thus be molded by casting onto a suitable mold, dry- or wet-spinning through a suitable spinneret or nozzle, extruding through a die of a suitable shape, or by coating (e.g., brush coating, spray coating, or dipping) on a suitable substrate. This provides articles of desired shapes such as films, sheets, plates, fibers, rods and coated films. More specifically, by taking up an example of shaping the solution into fibers by wet spinning, the resulting solution containing the polymer and the metal salt is extruded through a spinneret or nozzle into a coagulating bath composed of a liquid medium which is a non-solvent for the polymer and is miscible with the common solvent used to prepare the polymer solution to coagulate at least the surface of the extruded fibers, and as required, the resulting fibers are dried and/or drawn. The liquid medium constituting the coagulating bath differs according to the types of the polymer and the common solvent used. Generally, its examples include water, lower alcohols such as methanol, ethanol and propanol, and halogenated hydrocarbons such as chloroform and ethylene chloride.

The temperature of the coagulating bath differs according to the types of the polymer, the metal salt and the common solvent used. Generally, it is in the range of about 10° to about 50° C. Usually, room temperature suffices. The coagulating bath may be composed only of the liquid medium, or may further contain the aforesaid common solvent.

Advantageously, the extruded fibers are usually coagulated only at the surface layer (the core portion being maintained in the solution state), and then submitted to the next drying step. The thickness of the surface layer at this time is desirably 5 to 50%, preferably 10 to 30%, of the radius of the extruded fibers.

To attain such a coagulation ratio, it is proper to adjust the time for which the fibers are kept in contact with the coagulating bath. The contacting time varies depending upon the combination of the polymer, the common solvent and the liquid medium, the temperature, etc. Usually, it is 0.5 to 120 seconds, preferably 1 to 60 seconds.

The fibers which have been extruded and coagulated at least at the surface layer can then be dried. The drying can be effected by known means, such as hot air drying or infrared ray drying. The degree of the drying is such that the amount of the remaining solvent is less than 30% by weight, preferably less than 15% by weight, of the fibers.

The dried fibers can be drawn. Drawing can be carried out by known methods. For example, they can be drawn in heated air or a heated medium, or while they are in contact with a hot plate, a hot pin or hot rollers.

The drawing conditions can be varied by considering various factors such as the type of the starting polymer, the size of the fibers, the amount of the metal salt added and the physical properties required of the fibers. Generally, it is suitable to employ a drawing temperature of about 80° to 250° C., preferably 90° to 230° C., and a draw ratio of 2 to 20 times, preferably 3 to 18 times.

As a typical example, wet-spinning of the polymer in accordance with this invention has been described in detail. Articles obtained by other molding methods can be equally treated. A polymer article formed from the solution is dried until at least its surface layer is solidified. The drying can be carried out by methods such as hot air drying and infrared ray drying. Generally, the drying can be carried out until the amount of the solvent remaining in the article is not more than 10% by weight, preferably not more than 7% by weight, more preferably 1 to 5% by weight, of the molded article.

The polymer article containing the metal salt dispersed therein is then treated with a reducing agent to reduce the metal salt or metal ions which are present at least in the surface layer and also have migrated to the surface layer. This reduction can be easily effected by immersing the polymer article in a solution containing the reducing agent, or passing the polymer article through the solution or spraying the solution onto the polymer article thereby to contact the surface to be metallized of the polymer article with the solution of the reducing agent. Examples of reducing agents that can be used at this time include boron hydride compounds such as sodium borohydride, lithium borohydrides, aminoborane and dimethylaminoborane, ferrous salts such as $FeSO_4$, metal hydrogen phosphates such as sodium hydrogen phosphate, hydroxylamine sulfate, and sodium hydrosulfite. Usually, the boron hydride compounds are preferred.

The reduction with the reducing agent can be carried out usually at room temperature. If desired, it may be carried out under cooling at about 0° C. to room temperature or under heat at a temperature of up to about 90° C. The concentration of the reducing agent in the reducing agent solution is generally 0.01 to 20% by weight, preferably 0.05 to 10% by weight, more preferably 0.1 to 7% by weight. The solvent for dissolving the reducing agent may be, for example, water, methanol, ethanol, ethyl ether, hexane, benzene, methylene chloride, diglyme, tetrahydrofuran, dimethylacetamide, dimethyl sulfoxide or acetonitrile.

The reduction is usually carried out until the metal salt present at least in the surface layer is almost completely reduced As required, it may be stopped halfways.

The degree of reduction may be easily determined empirically by any one skilled in the art according to the combination of the polymer and the metal salt used or the type of the reducing agent. Usually, the suitable time of contact with the reducing agent solution is several tens of seconds to several tens of minutes. Before contacting with the reducing agent solution, the polymer article may be preliminarily heated. The solvent in the polymer article may be completely removed before contact with the reducing agent, or may partly be left. To metallize the polymer article from which the solvent has been completely removed, it is preferred to elevate the temperature of the reducing agent solution a little, or to heat the polymer article preliminarily before contacting.

The electrical conductivity, magnetic characteristics and surface reflecting ability of the resulting polymer article having a metallized surface can be adjusted as desired by properly selecting the polymer and the metal salt or by changing the operating conditions in the treatment with the reducing agent.

The method of this invention described above can give a polymer article having a metallized surface by a very simple and cheap procedure within short periods of time. Furthermore, since the polymer constituting the surface-metallized polymer article provided by the method of this invention is combined with the metal formed by reduction of the metal salt dispersed in it on a microscopic level, the degree of adhesion of the metal to the polymer article is much higher than that of a conventional surface-metallized polymer article formed by a plating method or a sputtering method. Accordingly, the polymer article obtained by this invention has excellent durability, peel resistance and resistance to rubbing and bending.

In addition, since the metallization of the polymer article can be carried out by using the reducing agent solution in the method of this invention, there is no restriction on the shape of the polymer article, and a surface-metallized polymer article of any desired shape can be obtained according to the final usage contemplated of the article. The electromagnetic characteristics of the surface metal can be reflected on the final polymer article, and its electrical conductivity, magnetic characteristics and surface reflecting ability can be adjusted easily according to the end usages. Moreover, since the metallization can be carried out by treatment at relatively low temperatures (10° to 90° C.), the inherent properties of the polymer are not adversely affected.

The surface-metallized polymer article produced by the method of this invention can be used in a very wide range of applications, for example as lightweight electrically conductive materials such as electrically conducting wires, communication wires, electrodes of electric cells, etc., antistatic materials, heaters, communication wave guide tubes, a core material of transformers, panel heaters, circuit base boards, capacitors and electromagnetic wave shielding material, and functional materials such as sensors, hard discs for memory, compact discs, catalysts, and transparent conductive films.

Furthermore, by utilizing the method of this invention, a surface-metallized polymer article may be obtained by applying a solution containing the polymer and the metal salt to the surface of a substrate such as natural or synthetic fibers or glass fibers by immersion or coating, and then contacting the substrate with the reducing agent solution A plastic having a metallized surface may be obtained by coating the solution of the polymer and the metal salt on a plastic by spraying, etc. and then contacting the coated plastic with the reducing agent solution. The metallized surface of the plastic so obtained can also be used as a substrate for plating.

The following Examples illustrate the method of this invention more specifically.

EXAMPLE 1

To a 15% dimethylacetamide (DMAc) solution of polyvinylidene fluoride ("Kynar 461", a product of Japan Synthetic Rubber Co., Ltd.) was added 30 PHR of $CoCl_2.6H_2O$. The resulting solution was cast onto a glass plate and dried to form a film. The film was immersed in a 0.3% aqueous solution of $NaBH_4$ (reducing agent) at room temperature. In about 1 minute after immersion, metallic cobalt deposited on the surface of the film. The resulting film was a surface-metallized film with a metallic luster which had a surface resistance of $2.27 \times 10^3 \, \Omega/\square$, a maximum magnetic flux density 41.58 gauss, a residual magnetization of 10.75 gauss, a coercivity of 225 Oe and a squareness ratio of 26.3%.

EXAMPLE 2

The same mixed solution as used in Example 1 was extruded into water through a nozzle, and coagulated and dried. The dried extrudate was immersed in a 0.5% aqueous solution of $NaBH_4$ (reducing agent). Immediately, metallic cobalt began to deposit and the deposition ended in about 5 minutes. The resulting fiber was black. Ten such black fibers each having a size of about 80 denier were bunbled, and set by a silver-epoxy paste at intervals of 20 mm. The resistance between the silver-epoxy pastes was measured, and found to be 22 $\Omega$.

EXAMPLE 3

A mixture of $CoCl_2.6H_2O$ and $NiCl_2.6H_2O$ in a ratio of 8:2 (30 PHR) was added to the same polymer solution as used in Example 1. The resulting solution was cast, and a surface-metallized film was obtained in the same way as in Example 1. The resulting film had a surface resistance of 2.98 $\Omega/\square$, a maximum magnetic flux density of 32.99 gauss, a residual magnetization of 19.77 gauss, a coercivity of 65 Oe and a squareness ratio of 59.9%.

EXAMPLE 4

$FeCl_3.6H_2O$ (40 PHR) was added to a 15% DMF solution of polyacrylonitrile ("Beslon", a product of Toho Rayon Co., Ltd.). The solution was cast on a glass plate and dried to obtain a film. The film was immersed in a 0.1% aqueous solution of $LiBH_4$ at room temperature to obtain a film having iron deposited on its surface. The resulting film had a resistance of $1.565 \times 10 \, \Omega/\square$, and showed ferromagnetism.

EXAMPLE 5

Ten grams of polyacrylonitrile ("Beslon", a product of Toho Rayon Co., Ltd ) and 5 g of $PdCl_2$ were dissolved in 50 ml of DMF. The solution was cast on a glass plate. The resulting film was immersed for 3 minutes in a 7% aqueous solution of $NaPH_2O_2$ (reducing agent) at $60 \pm 5°$ C. In about 1 minute after the immersion, Pd deposited on the surface of the film to form a surface-metallized film. The film surface was black or golden and had a surface resistance of $4.5 \Omega/\square$.

EXAMPLE 6

One gram of $NiCl_2.6H_2O$ was dissolved in 10 g of a polyimide varnish ("Sunever B410", a product of Nissan Chemical Industries, Ltd.). The solution was cast on a glass plate. The resulting film was immersed for 5 minutes in a 0 05% aqueous solution of $NaBH_4$ (reducing agent). In about 2 minutes after the immersion, Ni deposited on the film surface to give a surface-metallized film. The surface of the film had a metallic luster, and had a surface resistance of 22 $\Omega/\square$.

The above solution was coated on the surface of a plate of polycarbodiimide resin ("Carbodilite", a product of Nisshinbo Industries, Inc.), and subjected to a reducing treatment under the same conditions as above to form a resin article having a metallized surface. The metal had good adhesion to the resin article.

EXAMPLE 7

$NiCl_2.6H_2O$ was added to a 15% N-methyl-2-pyrrolidone (NMP) solution of polyvinylidene fluoride ("Kynar 461", a product of Japan Synthetic Rubber Co., Ltd.). The resulting solution was cast on a glass plate. The film formed was immersed in a 0.1% aqueous solution of $NaBH_4$ (reducing agent) at room temperature for 3 minutes In about 1 minute after the immersion, Ni deposited on the surface of the film to form a surface-metallized film. The film surface presented a metallic luster and had a surface resistance of $10^2$ $\Omega/\square$.

EXAMPLE 8

Ten grams of polyacrylonitrile ("Beslon", a product of Toho Rayon Co., Ltd.) and 5 g of $Cu(NO_3)_2.3H_2O$ were dissolved in 100 ml of DMF. The solution was cast on a glass plate. The resulting film was immersed in a 0.3% saturated aqueous sodium chloride solution containing 0.3% of $NaBH_4$ (reducing agent) at room temperature for 3 minutes. Cu deposited immediately after the immersing to form a surface-metallized film. The film surface presented a very goo luster, and had a surface resistance of 1.6 $\Omega/\square$.

EXAMPLE 9

Ten grams of polyacrylonitrile ("Beslon", a product of Toho Rayon Co., Ltd.) and 2.5 g of $CuCl_2.2H_2O$ were dissolved in 100 ml of DMF. The solution was cast on a glass plate. The resulting film was immersed in a 0.3% aqueous solution containing $NaBH_4$ (reducing agent) at room temperature for 3 minutes. Cu deposited immediately after the immersing to form a surface-metallized film. The film surface presented a very good cupper-like luster, and had a surface resistance of 0.45 $\Omega/\square$.

EXAMPLE 10

A solution composed of 10 parts by weight of an acrylonitrile/sodium styrenesulfonate copolymer (95:5 by weight; $[\eta]=0.83$ at 25° C. in DMF), 85 parts by weight of DMF and 5 parts of $CoCl_2.6H_2O$ was extruded through a nozzle having a diameter of 0.4 mm into an aqueous solution (DMAc/water=45/65 by weight) at room temperature. The resulting fiber was allowed to stay for 5 seconds in the aqueous solution, then dried by a far infrared heater for 10 minutes, and drawn to 6 times while being in contact with hot rollers at 130° C. The drawn fibers were immersed in a 0.2% aqueous solution of $LiBH_4$ at 20° C. for 5 minutes to reduce the metal salt.

The fiber had a tenacity of 2.8 g/d, an elongation of 27% and a resistance of 950 $\Omega/cm$ (the resistance per cm of the fiber).

EXAMPLE 11

A surface-metallized fiber was produced by the same method as in Example 10 except that instead of $CoCl_2.6H_2O$, the same amount of $Cu(CH_3COO)_2.6H_2O$ was used.

The resulting fiber had a tenacity of 2.5 g/d, an elongation of 29%, and a resistance of 100 $\Omega/cm$ (the resistance per cm of the fiber).

EXAMPLE 12

One gram of $NiCl_2.6H_2O$ was added to 10 g of a polyimide varnish ("Sunever B410", a product of Nissan Chemical Industries Ltd.). The solution was brush-coated on a heat-resistant porcelain plate and dried at 150° C. for 30 minutes to obtain a coated article (coating thickness 50 microns). The coated article was immersed in a 0.05% aqueous solution of $NaBH_4$ (reducing agent) at room temperature for 5 minutes. In about 2 minutes after the immersion, Ni deposited on the coated surface. The coated surface presented a metallic luster and had a surface resistance of 5 $\Omega/\square$.

EXAMPLE 13

One gram of $CoCl_2.6H_2O$ was dissolved in 20 g of a polyimide varnish ("Torayneece", a product of Toray Inc.); resin solids 23% by weight in a solvent composed of 55% by weight of NMP, 35% by weight of DMAc and 10% by weight of an aromatic hydrocarbon). The resulting solution was spray-coated on a plate of polydicyclopentadiene resin ("Metton", a tradename) and dried at 150° C. for 30 minutes to give a coated article (coating thickness 50 microns). The coated article was then immersed in a 0.05% aqueous solution of $NaBH_4$ (reducing agent) at room temperature for 3 minutes In about 1 minute after the immersion, Co deposited on the coated surface. The coated surface presented a metallic luster and had a surface resistance of 15 $\Omega/\square$. The adhesion of the metallized layer to the coating and the adhesion of the coating to the surface of the resin article were good.

EXAMPLE 14

A plate having Co deposited on its coated surface was produced by the same operation as in Example 13 except that the coating thickness was adjusted to 5 microns. The coated surface did not present a metallic luster and had a surface resistance of $10^2$ to $10^3$ $\Omega/\square$. When this coated article was immersed in a Ni plating bath ("SUMER-S680", a product of Nihon Kanizen Co., Ltd.) at 60° C., Ni began to deposit in 10 seconds, and a good metallized surface formed in 3 minutes. The plated film had a surface resistance of 3 $\Omega/\square$, and showed good adhesion to the coating.

EXAMPLE 15

$Ni(OAc)_2.6H_2O$ in N,N-dimethylformamide was dissolved in an acrylic paint ("AUTO ACLOSE SUPER", a product of Dainippon Paint Co., Ltd.) so that the weight ratio of the metal salt to the resin reached 1:3. The resulting paint was coated on a polymethyl methacrylate plate, dried and then immersed in a 0.1% aqueous solution of $NaBH_4$ (reducing agent) at room temperature. The coated film did not present a metallic luster, but was black. When this coated plate was immersed in a copper plating bath (made by Okuno Seiyaku Co., Ltd.) at 40° C., copper deposited and the surface of the plate showed a copper luster, and had a surface resistance of 1 Ω/□.

We claim:

1. A method of producing a polymer article having a metallized surface, which consists essentially of dissolving a polymer and a salt of a metal selected from the group consisting of iron, copper, nickel and cobalt in a common solvent, forming a polymer article containing the said metal salt dispersed therein from the solution, and then treating the article with a reducing agent the amount of the metal salt being from 1 to 200 parts by weight per 100 parts by weight of the polymer.

2. The method of claim 1 in which the polymer is a film-forming or fiber-forming polymer.

3. The method of claim 1 in which the metal salt is a sulfate, a nitrate or a chloride.

4. The method of claim 1 in which the amount of the metal salt is 5 to 150 parts by weight per 100 parts by weight of the polymer.

5. The method of claim 1 in which the polymer article is a film or a fiber, and the formation of the polymer article is carried out by casting or wet-spinning.

6. The method of claim 1 in which the treatment with the reducing agent is carried out by contacting the surface to be metallized of the article with a solution of the reducing agent.

7. The method of claim 6 in which the reducing agent is a boron hydride compound.

8. The method of claim 6 in which the concentration of the reducing agent in the reducing agent solution is 0.01 to 20% by weight.

* * * * *